(12) United States Patent
Craiovan et al.

(10) Patent No.: US 9,974,220 B2
(45) Date of Patent: May 15, 2018

(54) METHOD FOR FITTING PRINTED CIRCUIT BOARDS WITH COMPONENTS

(71) Applicant: SIEMENS AKTIENGESELLSCHAFT, München (DE)

(72) Inventors: Daniel Craiovan, Nürnberg (DE); Norbert Herold, Litzendorf (DE); Thorsten Kemper, Schnaittach (DE); Alexander Pfaffinger, München (DE); Christian Royer, Ottobrunn (DE)

(73) Assignee: Siemens Aktiengesellschaft, München (DE)

( * ) Notice: Subject to any disclaimer, the term of this patent is extended or adjusted under 35 U.S.C. 154(b) by 373 days.

(21) Appl. No.: 14/412,818

(22) PCT Filed: Apr. 24, 2013

(86) PCT No.: PCT/EP2013/058526
§ 371 (c)(1),
(2) Date: Jan. 5, 2015

(87) PCT Pub. No.: WO2014/005743
PCT Pub. Date: Jan. 9, 2014

(65) Prior Publication Data
US 2015/0195965 A1    Jul. 9, 2015

(30) Foreign Application Priority Data
Jul. 6, 2012 (DE) .................. 10 2012 211 812

(51) Int. Cl.
*H05K 13/08* (2006.01)
*H05K 3/30* (2006.01)
*G06Q 10/04* (2012.01)

(52) U.S. Cl.
CPC ............. *H05K 13/08* (2013.01); *H05K 3/303* (2013.01); *G06Q 10/043* (2013.01); *Y10T 29/49004* (2015.01); *Y10T 29/53174* (2015.01)

(58) Field of Classification Search
CPC ............ G05B 19/418; G05B 19/41805; G06Q 50/04; G06Q 10/043; H05K 7/14;
(Continued)

(56) References Cited

U.S. PATENT DOCUMENTS 5,170,554 A * 12/1992 Davis .................... H05K 13/08
29/832
5,258,915 A * 11/1993 Billington .............. G06Q 10/04
700/103

(Continued)

FOREIGN PATENT DOCUMENTS

CN   101122569 A   2/2008
CN   102356707 A   2/2012

(Continued)

OTHER PUBLICATIONS

Japanese Grand Decision for related Japanese Application No. 2015-518908.

(Continued)

*Primary Examiner* — Carl Arbes
(74) *Attorney, Agent, or Firm* — Lempia Summerfield Katz LLC

(57) ABSTRACT

A fitting system includes a plurality of fitting lines for fitting printed circuit boards with electronic components. A method for allocating printed circuit boards to the fitting lines includes determining requirements for fitting each of a plurality of printed circuit boards with components with which the plurality of printed circuit boards are to be fitted, determining an amount of printed circuit boards of which the component variances exceed a predetermined value, each (Continued)

component variance representing the number of different components with which a printed circuit board is to be fitted, and allocating the printed circuit boards to the fitting lines under the predetermined conditions via integral linear programming, such that the printed circuit boards of the amount are distributed as uniformly as possible over the fitting lines.

15 Claims, 4 Drawing Sheets

(58) Field of Classification Search
CPC ........ H05K 13/00; H05K 13/08; H05K 3/303; Y10T 29/53174
See application file for complete search history.

(56) References Cited

U.S. PATENT DOCUMENTS

| | | | | |
|---|---|---|---|---|
| 5,390,283 A * | 2/1995 | Eshelman | ............ | G06N 3/126 706/13 |
| 5,864,833 A * | 1/1999 | Schaffer | ............ | H05K 13/04 700/173 |
| 6,066,206 A * | 5/2000 | Doyle | ............ | H05K 3/1216 101/123 |
| 6,282,528 B1 * | 8/2001 | Schaffer | ............ | H05K 13/08 706/13 |
| 6,487,544 B1 * | 11/2002 | Eshelman | ............ | G06N 3/126 706/13 |
| 6,594,531 B2 * | 7/2003 | Eshelman | ............ | G06N 3/126 29/832 |
| 6,650,953 B2 * | 11/2003 | Schaffer | ............ | G05B 19/41865 700/100 |
| 6,829,514 B2 * | 12/2004 | Gyorfi | ............ | H05K 13/08 700/103 |
| 7,076,313 B2 * | 7/2006 | Welch | ............ | B25J 9/1664 700/103 |
| 7,738,985 B2 * | 6/2010 | Awata | ............ | G06Q 10/04 700/103 |
| 7,961,933 B2 | 6/2011 | Fujii et al. | | |
| 8,565,912 B2 * | 10/2013 | Wappling | ............ | B25J 9/1687 209/629 |
| 8,793,008 B2 | 7/2014 | Bauer et al. | | |
| 2008/0040058 A1 | 2/2008 | Fujii et al. | | |
| 2012/0004762 A1 * | 1/2012 | Bauer | ............ | H05K 13/08 700/219 |

FOREIGN PATENT DOCUMENTS

| | | |
|---|---|---|
| DE | 102009013353 B3 | 10/2010 |
| EP | 0478360 A1 | 4/1992 |
| EP | 0478361 A1 | 4/1992 |
| JP | H04246897 A | 9/1992 |
| JP | 2006287075 A | 10/2006 |

OTHER PUBLICATIONS

Chinese office Action for related Chinese Application No. 201380036073.X dated May 12, 2016 with English Translation.
Hans-Otto et al., "Workload Planning in Small Lot Printed Circuit Board Assembly", O.R. Spectrum, Jun. 1, 1997, pp. 147-157, vol. 19, No. 2.
International Search Report and Written Opinion in corresponding PCT Application No. PCT/EP2013/058526 dated Nov. 11, 2014, with English translation.

* cited by examiner

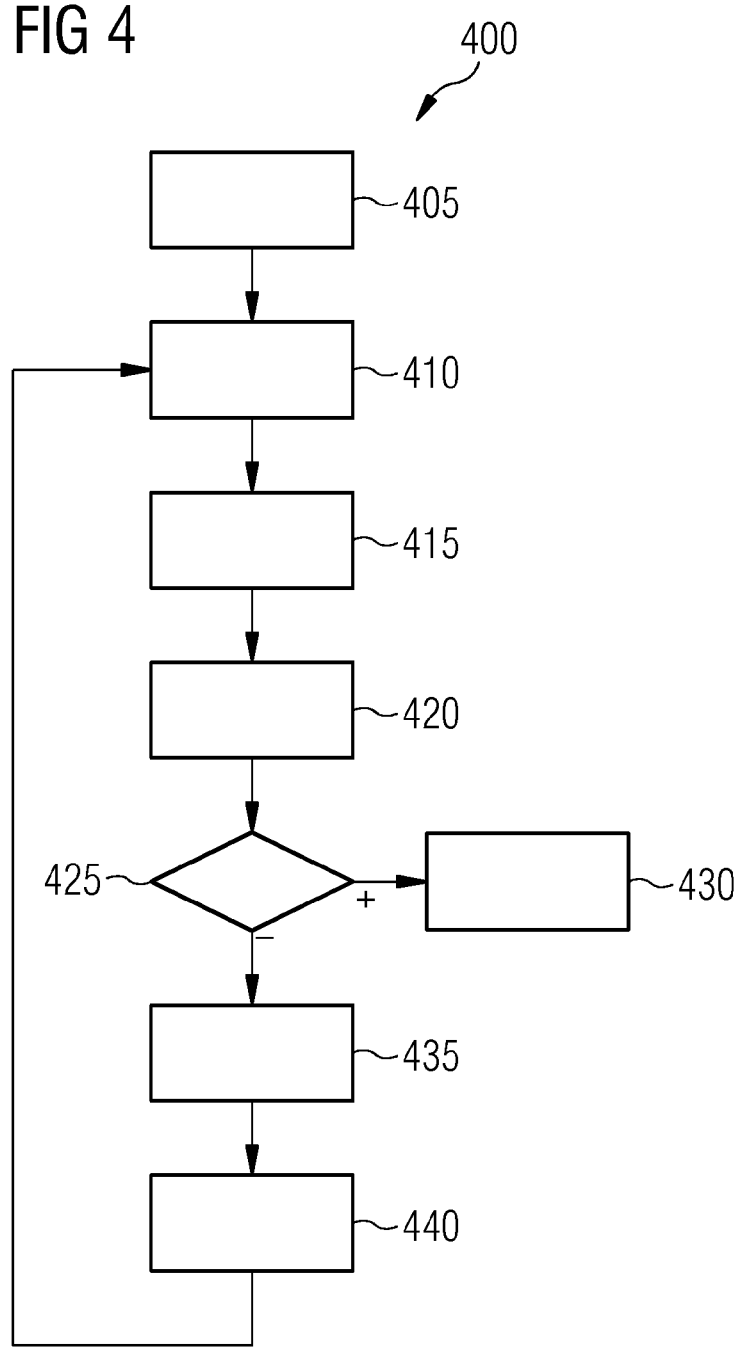

METHOD FOR FITTING PRINTED CIRCUIT BOARDS WITH COMPONENTS

The present patent document is a § 371 nationalization of PCT Application Serial Number PCT/EP2013/058526, filed Apr. 24, 2013, designating the United States, which is hereby incorporated by reference in its entirety. This patent document also claims the benefit of DE 10 2012 211 812.8, filed on Jul. 6, 2012, which is also hereby incorporated by reference in its entirety.

FIELD

The disclosed embodiments relate to allocation of printed circuit boards to fitting lines.

BACKGROUND

In the field of electronics production, printed circuit boards or subassemblies to be produced are produced on surface mounted technology (SMT) fitting lines via surface mounting. However, due to technical restrictions, not every printed circuit board may be produced on every fitting line. The printed circuit boards also usually have different production times on the fitting lines. In addition, the maximum production time capacities of the fitting lines must not be exceeded.

DE 10 2009 013 353 B3 shows a method for equipping such a fitting line.

EP 0 478 360 A1 relates to another fitting method in which an attempt is made to improve a set-up time for a production line for fitting printed circuit boards with components.

Hans-Otto Günther et al. "Workload planning in small lot printed circuit board assembly", OR Spectrum, Vol. 19, No. 2, Jun. 1, 1997, pages 147-157 relates to the planning of a workload during the automated fitting of printed circuit boards with components.

EP 0 478 361 A1 relates to a method for fitting printed circuit boards with components, in which case a production frequency of a printed circuit board type and the components needed for production are taken into account.

Printed circuit boards are usually allocated to fitting lines of a fitting system manually or semi-automatically on the basis of empirical values or heuristics. In this case, unbalanced allocations are repeatedly made, which causes high utilization of one component of a fitting line with low utilization of another component, with the result that the fitting system is not used in an optimal manner.

SUMMARY AND DESCRIPTION

The present embodiments may obviate one or more of the drawbacks or limitations in the related art. For example, an improved technique for allocating printed circuit boards to fitting lines may be provided.

The disclosed embodiments relate to a method for allocating printed circuit boards to fitting lines for fitting the printed circuit boards or other subassemblies with components. The disclosed embodiments also relate to a control device for a production or assembly line for fitting printed circuit boards with components. The disclosed embodiments also relate to a computer program product and to a computer-readable medium.

A fitting system includes a plurality of fitting lines for fitting printed circuit boards with electronic components. A method for allocating printed circuit boards to the fitting lines includes acts of detecting requirements for fitting a plurality of printed circuit boards with components to be respectively fitted, determining a set of printed circuit boards, the component variances of which exceed a predetermined amount, a component variance respectively representing the number of different components to be fitted on a printed circuit board, and allocating the printed circuit boards to the fitting lines under the given specifications via integer or mixed integer linear programming such that the printed circuit boards in the set are distributed as uniformly as possible over the fitting lines. One of the parameters of the integer linear programming is selected such that the uniform distribution of the printed circuit boards in the set over the fitting lines is optimized during allocation.

Complex printed circuit boards may be identified and collected in the set, such that allocation of an excessively large number of complex printed circuit boards to a fitting line may be avoided. The situation in which a fitting line has to be frequently converted may be avoided because the components held at the fitting line are not sufficient for all printed circuit boards allocated to the fitting line. If the fitting line has a fitting machine with a plurality of feed tables, an increased number of fixed tables may be formed during production. The fixed tables do not have to be changed for allocating a printed circuit board to the fitting line. A number of shuttle tables to be held and the associated outlay in terms of equipment and maintenance may be reduced. Costs of substantial orders of magnitude may therefore be saved. The method may be applied, in principle, to all types of fitting systems.

In one embodiment, no more than a predetermined number of printed circuit boards from the set is allocated to a fitting line. This predetermined number may be 1 or 2, for example. With the restriction, the fitting line may be protected from frequent interventions for the purpose of changing held components on account of excessive component variances. In one embodiment, the predetermined number is individually determined for each fitting line based on characteristic numbers or skills of each fitting line.

In a further embodiment, which may be combined with the last-mentioned embodiment, at least a predetermined number of printed circuit boards from the set may be allocated to a fitting line. The existing capacities of the fitting line may thus be sensibly used. The printed circuit boards in the set may thus be able to be processed in real time. In this case too, the predetermined number may be individually determined.

In one embodiment, allocation of a printed circuit board to a fitting line is prevented if the component variance of the symmetrical difference between the components to be fitted on both printed circuit boards exceeds a predetermined limit. Jointly usable components of both printed circuit boards may thus be taken into account, such that printed circuit boards that hinder one another on a fitting line may be determined in an improved manner. Unfavorable combinations of printed circuit boards that are allocated to the same fitting line and may result in a greatly increased equipment outlay may therefore be avoided.

In one embodiment, the allocation is prevented only if the component variances of both printed circuit boards also each exceed a predetermined limit Only complex printed circuit boards may be compulsorily allocated to different fitting lines. Printed circuit boards with low component variances do not hinder one another very much, with the result that mutual exclusion of such printed circuit boards may not be necessary.

Furthermore, the allocation may be prevented only if the component variance of the union of the components to be fitted on both printed circuit boards also exceeds a predetermined limit. That the positive aspect of jointly usable components may entirely or partially compensate for the negative effect of disjoint components may be taken into account. The determination of the relative diversity of the printed circuit boards may be further improved.

In one embodiment, the integer linear program includes acts of determining a starting allocation of printed circuit boards to fitting lines as the current allocation, and allocating a selected set of printed circuit boards to the fitting lines based on the current allocation via integer or mixed integer linear programming A substantial or complex allocation problem that may be caused by a large number of different printed circuit boards, a large number of different components to be fitted on the printed circuit boards, or production lines with different properties, may therefore also be solved in an acceptable time with sufficient quality. The allocation of the printed circuit boards to the fitting lines for the starting allocation may be implemented randomly or in a targeted manner. In this case, the fitting lines that are intended to be optimized may be selected, for example, where the other fitting lines are left constant. The starting allocation may also be implemented via a heuristic allocation.

In one refinement, the method may be implemented iteratively until the particular allocation has reached a predetermined quality or a predetermined processing time has expired. An optimum solution may thus be gradually approached.

A computer program product includes program code to implement the described method. The computer program product may be executed by a processor or processing device and is stored on a non-transitory computer-readable storage medium. The computer program product may be created in a conventional programming language (for example, C++ or Java). The processing device may include or be a component of a commercially available computer or server with corresponding input, output and storage devices.

A control device for allocating printed circuit boards to fitting lines of a fitting system is configured to implement the method stated above.

BRIEF DESCRIPTION OF THE DRAWINGS

FIG. 4 shows a flowchart of a second method that forms part of the method of FIG. 3 in accordance with one embodiment.

DETAILED DESCRIPTION

Linear optimization is one of the methods in the field of mathematical optimization. Linear optimization deals with the optimization of linear target functions over a set. The set is restricted by linear equations and inequalities. Linear optimization is the basis of the solution methods of (mixed) integer linear optimization.

Advantages of linear optimization include:
Global optimization approach;
Easily expandable;
Very good commercial standard solvers (SCIP, CPLEX, Ilog, Xpress), which are widespread and proven in practice; and, For a determined solution, it is known how far away it is at most from the optimal solution (gap).

Figure 1:
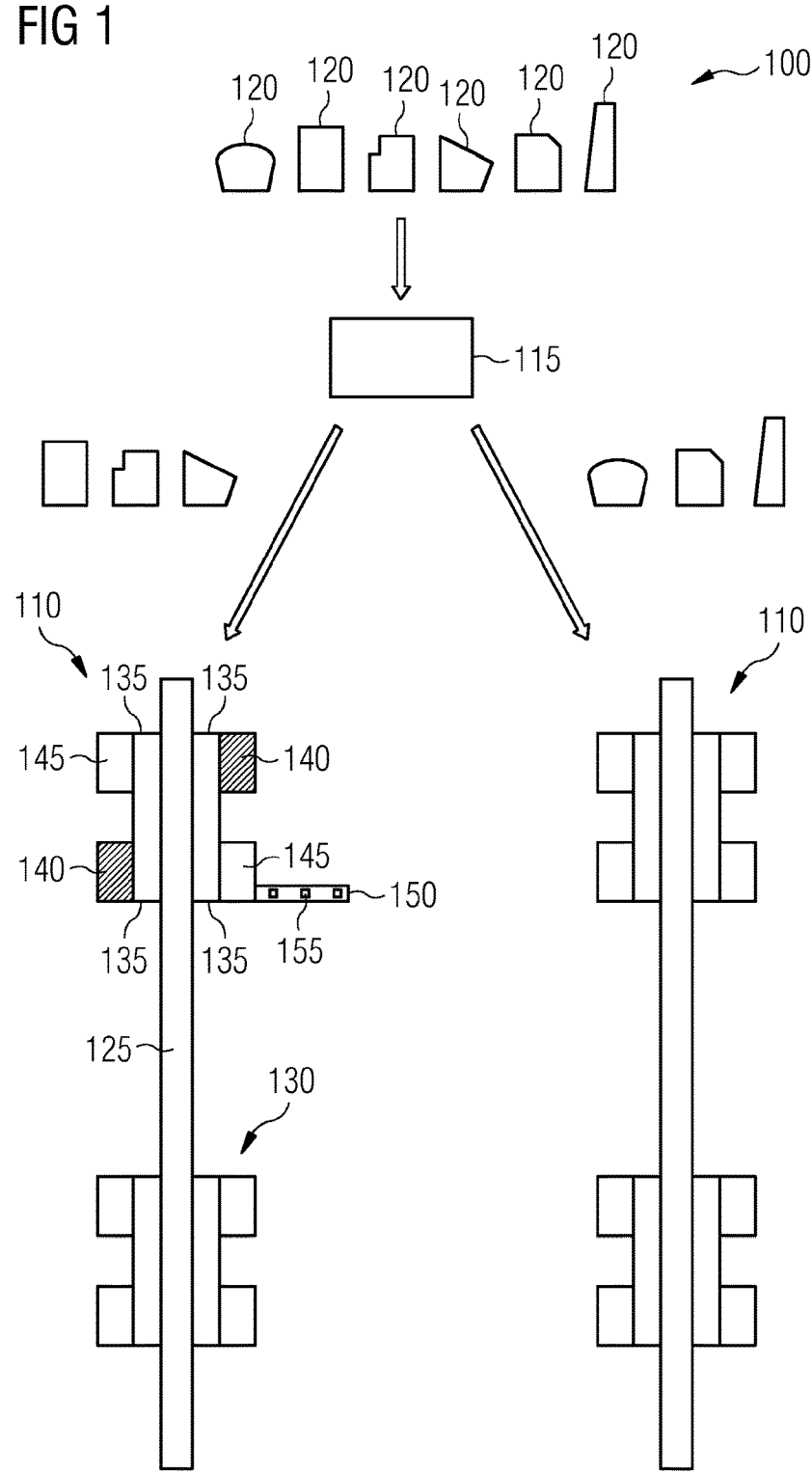
FIG. 1 shows a fitting system in accordance with one embodiment.

FIG. 1 shows a fitting system 100. The fitting system 100 includes a plurality of fitting lines 110 and a control device 115 for allocating printed circuit boards 120 to the fitting lines 110. Each fitting line 110 usually includes a transport system 125 and one or more fitting machines 130. Each fitting machine 130 includes one or more fitting heads 135. Each fitting head 135 is configured to receive components from a constant table 140 or a variable table 145. Each fitting head 135 is configured to position the components at a predetermined position on the printed circuit board 120, which is on the transport system 125.

During the fitting process, the printed circuit board 120 is usually still with respect to the fitting machine 130. Each of the tables 140, 145 includes a multiplicity of feeding devices 150, only one of which is illustrated by way of example. Each feeding device 150 keeps a supply of components 155 of a predetermined type ready. Although each feeding device 150 may be configured to keep different components 155 ready and different feeding devices 150 are fitted to a table 140, 145, the tables 140, 145 are usually completely exchanged for reasons of speed if a fitting machine 130 is supplied with components 155 that are not held on one of the fitted tables 140, 145.

Since such a change is usually associated with a production standstill, the aim is to keep the number of tables 140, 145 to be changed low. If a table is not exchanged during a conversion process, it is referred to as a constant table 140, otherwise it is referred to as a variable table 145. Otherwise, there are no functional differences between a constant table 140 and a variable table 145.

The printed circuit board 120 is fitted with a number of different components 155. In order to minimize frequent changing of variable tables 145 and ideally to maximize a number of constant tables 140, the control device 115 is configured to optimize the allocation of a printed circuit board 120 to one of the fitting lines 110. In this case, specific properties of each fitting line 110 and of each fitting machine 130 may be taken into account, as the properties of the printed circuit boards 120 and of the components 155 to be fitted on the printed circuit boards 120 may be taken into account.

Figure 2:
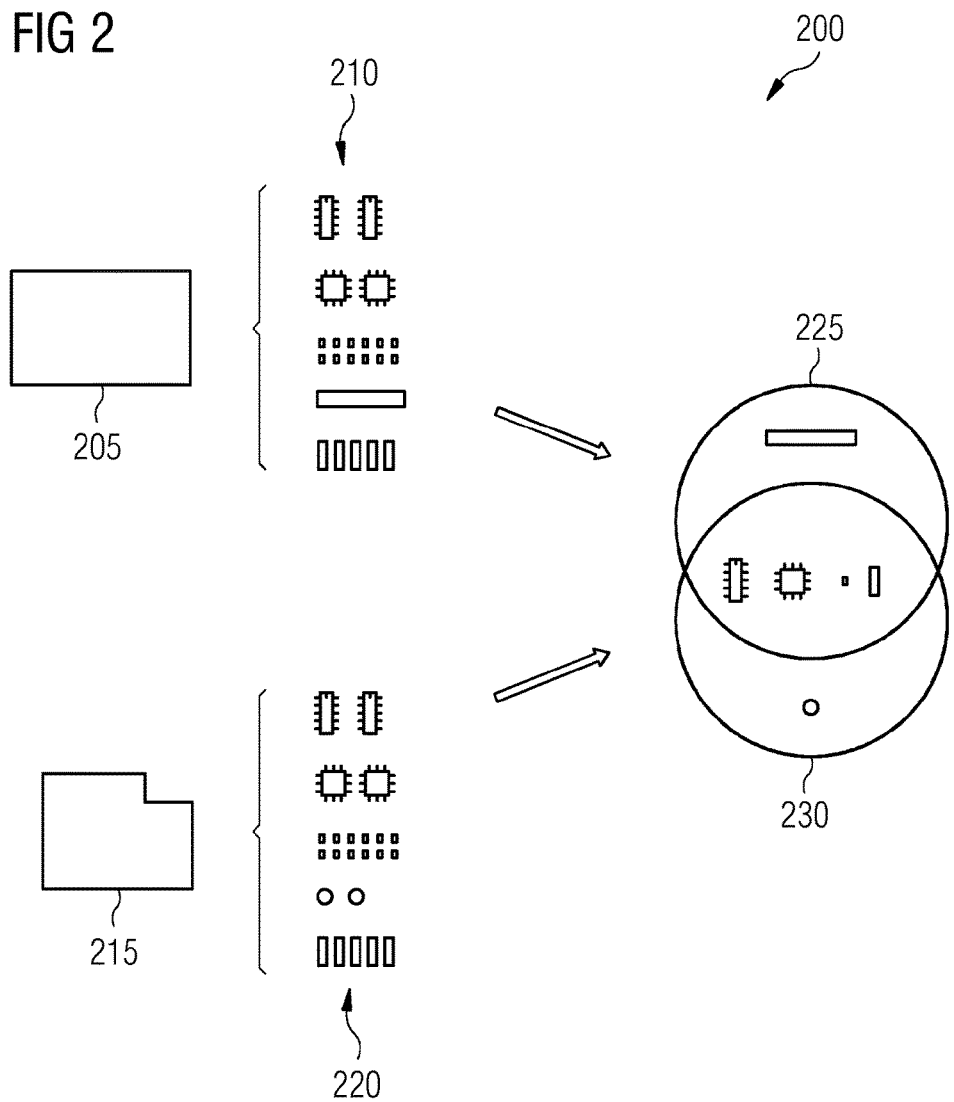
FIG. 2 shows a schematic view of component variances of printed circuit boards shown in FIG. 1.

FIG. 2 shows an illustration of component variances of printed circuit boards 120 from FIG. 1. A set 200 of complex printed circuit boards 120 includes a first printed circuit board 205 to be fitted with a first set 210 of components 155, and a second printed circuit board 215 to be fitted with a second set 220 of components 155 from FIG. 1. Both printed circuit boards 205, 215 correspond to one of the printed circuit boards 120 from FIG. 1.

The first set 210 includes components 155 of five different component types, which may be kept ready in at least five different feeding devices 150 in the fitting line 110.

In a similar manner, the second set 220 likewise includes components 155 of five different component types, which may be kept ready in at least five different feeding devices 150. Components 155 illustrated horizontally beside one another are identical to one another and are usually held in the same feeding device 150, in which case an infinite supply of available components 155 of a component type is usually assumed as part of the allocation problem.

The number of different components 155 to be fitted on a printed circuit board 205, 215 is called the component variance of the printed circuit board 205 or 215. The component variance of both printed circuit boards 205, 215 together is therefore the number of different components 155 to be fitted on both printed circuit boards 205, 215.

Different components 155 are also called component types below. A first set 225 of component types may therefore be fitted on the first printed circuit board 205 and a second set 230 of component types may be fitted on the second printed circuit board 215, the number of component types contained in the sets 225, 230 respectively corresponding to the component variance. The component variance of both printed circuit boards 205 and 215 together therefore corresponds to the number of component types in the union of sets 225 and 230. Although each of the printed circuit boards 205, 215 therefore respectively has a component variance of 5, the component variance of both printed circuit boards 205, 215 together is 6 since a component 155 is a component type not used on the respective other printed circuit board 120 to be fitted.

In order to allocate printed circuit boards 120 to the fitting lines 110 as advantageously as possible, the aim is to allocate printed circuit boards 205, 215 with a high component variance to the fitting lines 110 as uniformly as possible. In one embodiment, an attempt is made to minimize as far as possible differences in pairs between the numbers of printed circuit boards 120 of high component variance that are allocated to a fitting line 110. In another embodiment, a lower limit and an upper limit for the respective numbers of complex printed circuit boards 120 on the fitting lines 110 are predefined. A lower limit may be 1 or 2, for example, where an upper limit may be between 2 and 4, for example. A sufficiently uniform allocation of complex printed circuit boards 120 to fitting lines 110 may be accepted when the numbers do not exceed or undershoot the predetermined limits.

Figure 3:
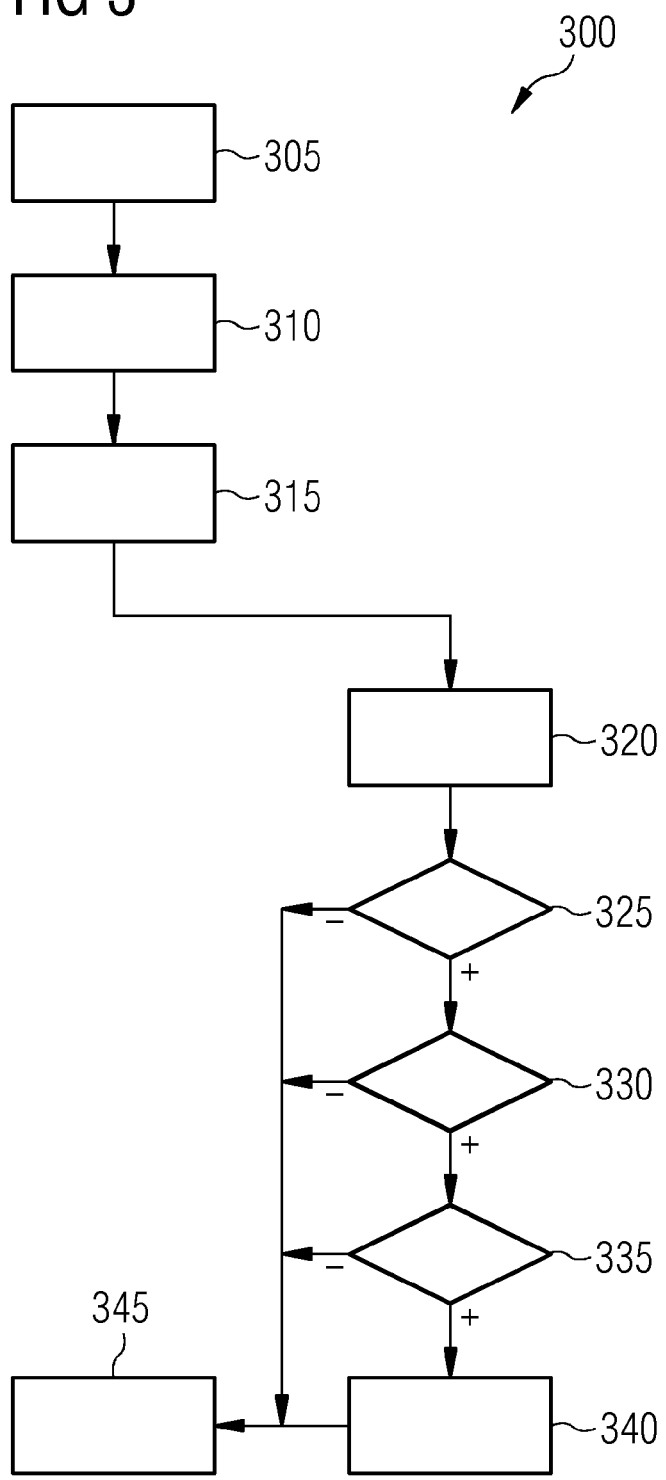
FIG. 3 shows a flowchart of a first method in accordance with one embodiment.

FIG. 3 shows a flowchart of a first method 300 for implementing this allocation.

In act 305, requirements for allocating printed circuit boards 120 are first of all detected. A requirement defines a printed circuit board 120 and the components 155 to be fitted on the printed circuit board. A number of boundary conditions may additionally be specified, for example, which printed circuit board 120 on which fitting line 110 may be fitted with components, or which component 155 may be processed by the fitting line 110. Further boundary conditions are found below in the discussion of the mathematical background.

In act 310, a component variance is determined for each of the printed circuit boards 120, as stated above with reference to FIG. 2.

In act 315, a set 200 of printed circuit boards 120, the component variances of which are particularly high, is determined. Those printed circuit boards whose component variances are above a predetermined threshold may be sorted into the set 200. Alternatively, the printed circuit boards 120 may also be sorted according to the respective component variances thereof, and a predetermined number of printed circuit boards 120 with the highest component variances may be accepted into the set 200.

Mixed forms and other procedures are likewise possible.

In one embodiment, printed circuit boards 120 may then be immediately allocated to fitting lines 110 in an act 345. However, which printed circuit boards 205, 215 in the set 200 determined in step 315 require very (or substantially) different sets 225, 230 of component types may be determined beforehand in order to allocate such printed circuit boards 205, 215 to fitting lines 110 that are as different as possible. In another embodiment, this determination is implemented at an earlier time, such that the set 200 is formed in act 315 such that only very (or substantially) different complex printed circuit boards 120 are included in the set 200.

In act 320, in order to determine their diversity, two printed circuit boards 120 are selected from the set 200 of complex printed circuit boards 120. The selection may be implemented in a plurality of iterative passes such that all pairs of printed circuit boards 120 in the set 200 may finally be checked with respect to the diversity of the component types to be fitted thereon. The printed circuit boards 205 and 215, for instance, are selected based on the example of FIG. 2.

In act 325, whether the number of component types in each set 225, 230 of component types to be fitted on the selected printed circuit boards 205 and 215 exceeds a predetermined first limit is determined. In the example of FIG. 2, five component types are respectively to be fitted on both printed circuit boards 205 and 215; each of the corresponding sets 225 and 230 contains 5 component types.

In act 330, if the first limit is exceeded, as described, the method continues with act 330, in which a check is implemented in order to determine whether the number of component types of the symmetrical difference between the sets 225 and 230 exceeds a predetermined second limit. The symmetrical difference between the sets 225 and 230 includes the union of sets 225 and 230 minus the intersection of sets 225 and 230. In other words, the symmetrical difference includes those component types that are disjoint between the printed circuit boards 205 and 215, i.e., those types that are present exclusively only in the first set 225 or only in the second set 230. In the examples described in connection with FIG. 2, the symmetrical difference includes two component types.

In act 335, if the number of disjoint components 155 exceeds the second limit, act 335 determines whether the union of sets 225 and 230 includes more component types than predefined by a third predetermined limit. In the example of FIG. 2, the union includes 6 component types. If this test is also positive, an act 340 prevents the pairing of the selected printed circuit boards 205 and 215 on the same fitting line 110.

In contrast, if the test in one of acts 325 to 335 is negative, the pairing of the printed circuit boards 205 and 215 is not explicitly prevented. As a result, however, it is not yet ensured whether the selected printed circuit boards 205 and 215 are then also allocated to the same fitting line 110 in act 345. In other embodiments of the method 300, one or more of acts 325 to 335 may also be dispensed with. In addition, a different order of acts 325 to 335 may also be used.

In act 345, the printed circuit boards 120 are then finally allocated to the fitting lines 110 such that the printed circuit boards 120 in the set 200 determined in act 315 are distributed as uniformly as possible over the different fitting lines 110. In addition to the possible boundary condition of the pairing of the very different printed circuit boards 205, 215 which needs to be avoided, the allocation may also take into account further boundary conditions, such as peculiarities of a fitting machine 130 of a fitting line 110, for instance the possibility for handling especially large or especially small components 155.

The allocation in act 345 under the given specifications may be implemented using integer linear programming.

An embedded method 400 is illustrated in FIG. 4 in the form of a flowchart.

In act 405, a starting allocation of printed circuit boards 120 to fitting lines 110 is determined and a current allocation is equated to the starting allocation. Different heuristics, which may also include manual specifications or restrictions, are possible for determining the starting allocation.

In act 410, a subset of printed circuit boards 120 is selected from the printed circuit boards 120 to be allocated.

In act 415, one or more alternative allocations of printed circuit boards 120 in the subset to the fitting lines 110 are formed, such as via integer linear programming This allocation is implemented in the manner described in connection with FIG. 3 such that the different complex printed circuit boards 120 are allocated as uniformly as possible to the fitting lines 110. At the same time, the component variance of all fitting lines 110 is minimized as far as possible.

In act 420, the qualities of the allocations formed in act 415 are determined or adopted from the linear optimization parameters from act 415. In this case, one or more quality parameters that may include, for example, a degree of utilization of a fitting machine 130 or the ratio of constant tables 140 to variable tables 145, are usually predefined. In connection with the method of FIG. 3, the component variance of all fitting lines 110 may be minimized as far as possible as the single quality parameter.

In act 425, a check is implemented in order to determine whether a predetermined abort criterion has been reached. The abort criterion may include an allocation of a predetermined quality or the expiry of a predetermined computing time for the method 400.

In act 430, the allocations determined are output if the abort criterion has been satisfied.

In act 435, otherwise, those allocations that are intended to be optimized further may be selected from the allocations determined.

In act 440, in this case, the current allocation is set to one of the allocations to be optimized and the method 400 may be implemented again from act 410. If a plurality of allocations that may be optimized have been selected, the method 400 may also be accordingly branched repeatedly in a parallel manner.

Mathematical Background

Exact mathematical methods may be used to achieve considerably better solutions than with heuristics previously used in practice. In further contrast thereto, good production times may also be achieved with these methods.

When allocating printed circuit boards 120 or subassemblies to a fitting line 110, not every printed circuit board 120 may possibly be produced on every fitting line 110 on account of technical restrictions. The printed circuit boards usually also have different production times on the fitting lines 110. In addition, the maximum production time capacities of the fitting lines 110 must not be exceeded.

When allocating printed circuit boards 120 to fitting lines 110, the following aims are usually pursued:
- maximize the number of printed circuit boards 120 to be produced using constant tables 140 in order to reduce the conversion effort;
- minimize the number of equipment families on the fitting lines 110 in order to reduce the amount of conversion time;
- requiring as little equipment as possible (for example conveyor 150); and,
- minimizing the total production time for the printed circuit boards 120.

In this case, an equipment family is determined as a set of printed circuit boards that may be fitted with components on a fitting line without changing the set of component types that are kept ready at the fitting line for fitting. The set of component types kept ready at the fitting line is also called equipment. It is usually assumed that a sufficiently large number of components of each component type is always kept ready at the fitting line.

More printed circuit boards than may be included in an equipment family are usually allocated to a fitting line since an arbitrary number of component types is not kept ready at the fitting line. The fitting line is therefore occasionally subjected to an equipment change in which the equipment for a first equipment family is exchanged for the equipment for a second equipment family. The rarer these equipment changes are and the fewer component types that have to be exchanged during an equipment change, the more cost-effectively the fitting system may be operated.

An attempt is usually made to achieve these aims by striving for the best possible component coverage of the printed circuit boards 120 of a fitting line 110 or minimizing the sum of component variances of the fitting lines 110.

Integer programming (IP) models (IP stands for integer programming or integer program or integer optimization model) are used to determine an optimized allocation of printed circuit boards 120 to fitting lines 110. This determination may be implemented using a known standard solver.

The following indices may be used:

| | |
|---|---|
| L | Set of SMT fitting lines 110 of the system 100 |
| R | Set of printed circuit boards 120 |
| C | Set of component types 155 |
| $R_c$ | Set of printed circuit boards with component type c |
| $R_l$ | Set of printed circuit boards which can be fitted with components on line 1 |

The following parameters may be used:
$Time_{r,l}$ Total production time for printed circuit board r on line 1
$TimeLimit_l$ Production time limit on line 1

The following binary variables may be used:
$Assign_{r,l}$ Allocation of printed circuit board r to line 1
$Setup_{c,l}$ Use of a component c on a line 1

The IP formulation may be as follows:

$$\text{minimize} \sum_{c \in C} \sum_{l \in L} Setup_{c,l}$$

s.t.:

$$\sum_{l \in L} Assign_{r,l} = 1 \qquad r \in R$$

$$Assign_{r,l} = 0 \qquad l \in L, r \in R/R_l$$

$$\sum_{r \in R_c} Assign_{r,l} \le Setup_{c,l} |R_c| \qquad c \in C, l \in L$$

$$\sum_{r \in R} Assign_{r,l} Time_{r,l} \le TimeLimit_l \qquad l \in L$$

$$Setup_{c,l} \in \{0, 1\} \qquad c \in C, l \in L$$

$$Assign_{r,l} \in \{0, 1\} \qquad r \in R, l \in L$$

In order to improve the allocation of complex printed circuit boards 120 over the fitting lines 110, the solver may be provided with further conditions.

A first condition or requirement may involve allocating only a predetermined number $MaxCountBig_l$ of printed circuit boards or subassemblies 120 of printed circuit boards 120 that are very different in pairs and have high component variance to a fitting line 1. In this case, $MaxCountBig_l$ is usually selected to be very low, generally 1 or 2.

$$\forall\, l \in L: \sum_{r \in R_{Big}} \text{Assign}_{r,l} \leq \text{MaxCountBig}_l$$

where: l corresponds with fitting line 110, MaxCountBig corresponds with the first predetermined number, and $R_{Big}$ corresponds with the set 200 of printed circuit boards 1 which are very different in pairs.

It may also be required that a minimum number $\text{MinCountBig}_l$ of printed circuit boards from the set $R_{Big}$ is allocated to each line 1.

In this case, $\text{MinCountBig}_l$ is usually selected to be very low, generally only 1.

$$\forall\, l \in L: \sum_{r \in R_{Big}} \text{Assign}_{r,l} \geq \text{MinCountBig}_l$$

where MinCountBig corresponds with the second predetermined number.

In addition, it may also be required that a printed circuit board r is not intended to be allocated to a fitting line 1 together with a printed circuit board r' from a set $RF_{r,l}$.

$$\forall\, l \in L: |RF_{r,l}|\text{Assign}_{r,l} + \sum_{r' \in RF_{r',l}} \text{Assign}_{r',l} \leq |RF_{r,l}|$$

Using at least one of these criteria, the complex printed circuit boards 120 may be distributed across the fitting lines 110 in an improved manner, with the result that conversions of fitting lines 110 may be reduced. In addition, production times of printed circuit boards 120 in the fitting system 100 may be improved. Furthermore, the allocations may be determined more quickly than previously known using the approach described by means of an IP solver.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for fitting printed circuit boards with components via fitting lines of a fitting system for fitting the printed circuit boards with electronic components, the method comprising:
   detecting requirements for fitting a plurality of printed circuit boards with components to be respectively fitted, each requirement defining a respective printed circuit board of the plurality of printed circuit boards and the components to be fitted thereon;
   determining a set of printed circuit boards from the plurality of printed circuit boards, the set of printed circuit boards having component variances of which that exceed a predetermined amount, each component variance representing a respective number of different components to be fitted on a respective printed circuit board of the set of printed circuit boards;
   determining pairs of printed circuit boards from the set of printed circuit boards that require substantially different sets of components;
   allocating the determined printed circuit boards to the fitting lines via integer linear programming such that the determined printed circuit boards are allocated to respective fitting lines of the fitting system that are as different as possible, the integer linear programming comprising determining a starting allocation of printed circuit boards to fitting lines as a current allocation, and allocating printed circuit boards in the set of printed circuit boards to the fitting lines based on the current allocation using an optimization program via the integer linear programming; and
   fitting the plurality of printed circuit boards with the components on the respectively allocated fitting lines.

2. The method of claim 1, wherein allocating the determined printed circuit boards comprises allocating no more than a predetermined number of printed circuit boards from the set of printed circuit boards to a respective fitting line of the fitting system.

3. The method of claim 1, wherein allocating the determined printed circuit boards comprises allocating at least a predetermined number of printed circuit boards from the set of printed circuit boards to a respective fitting line of the fitting system.

4. The method of claim 1, wherein allocating the determined printed circuit boards comprises preventing allocation of two printed circuit boards to a fitting line if the component variance of a symmetrical difference between the components to be fitted on both printed circuit boards exceeds a predetermined first limit.

5. The method of claim 4, wherein preventing the allocation is implemented only if the component variances of both printed circuit boards also each exceed a predetermined second limit.

6. The method of claim 4, wherein preventing the allocation is implemented only if the component variance of a union of the components to be fitted on both printed circuit boards also exceeds a predetermined third limit.

7. The method of claim 1, wherein allocating the determined printed circuit boards comprises implementing the integer linear programming iteratively until the allocating has reached a predetermined quality in terms of minimizing the component variance of all fitting lines or a predetermined processing time has expired.

8. The method of claim 2, wherein the predetermined number is one or two.

9. The method of claim 2, wherein allocating the determined printed circuit boards comprises allocating at least a predetermined number of printed circuit boards from the set of printed circuit boards to a respective fitting line of the fitting system.

10. The method of claim 2, wherein allocating the determined printed circuit boards comprises preventing allocation of two printed circuit boards to a fitting line if the component variance of a symmetrical difference between the components to be fitted on both printed circuit boards exceeds a predetermined first limit.

11. The method of claim 3, wherein allocating the determined printed circuit boards comprises preventing allocation of two printed circuit boards to a fitting line if the component variance of a symmetrical difference between the components to be fitted on both printed circuit boards exceeds a predetermined first limit.

12. The method of claim 5, wherein preventing the allocation is implemented only if the component variance of a union of the components to be fitted on both printed circuit boards also exceeds a predetermined third limit.

13. The method of claim 2, wherein allocating the determined printed circuit boards comprises implementing the integer linear programming iteratively until the allocating has reached a predetermined quality in terms of minimizing the component variance of all fitting lines or a predetermined processing time has expired.

14. The method of claim 3, wherein allocating the determined printed circuit boards comprises implementing the integer linear programming iteratively until the allocating has reached a predetermined quality in terms of minimizing the component variance of all fitting lines or a predetermined processing time has expired.

15. The method of claim 4, wherein allocating the determined printed circuit boards comprises implementing the integer linear programming iteratively until the allocating has reached a predetermined quality in terms of minimizing the component variance of all fitting lines or a predetermined processing time has expired.

* * * * *